United States Patent
Zhu

(10) Patent No.: US 9,730,346 B2
(45) Date of Patent: Aug. 8, 2017

(54) CLAMSHELL STRUCTURE FOR ELECTRONIC DEVICE

(71) Applicants: Inventec (Pudong) Technology Corporation, Shanghai (CN); INVENTEC CORPORATION, Taipei (TW)

(72) Inventor: Hui Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/049,564

(22) Filed: Feb. 22, 2016

(65) Prior Publication Data

US 2017/0196106 A1   Jul. 6, 2017

(30) Foreign Application Priority Data

Jan. 5, 2016   (CN) .......................... 2016 1 0004199

(51) Int. Cl.
*H05K 5/02*   (2006.01)
*H05K 5/03*   (2006.01)

(52) U.S. Cl.
CPC ......... *H05K 5/0239* (2013.01); *H05K 5/0208* (2013.01); *H05K 5/03* (2013.01)

(58) Field of Classification Search
CPC . G11B 33/027; G11B 23/045; G11B 17/0405; G06F 1/181; G06F 1/182;

(Continued)

(56) References Cited

U.S. PATENT DOCUMENTS

| 4,451,101 A | * | 5/1984 | Davis | H01R 13/447 |
| | | | | 174/67 |
| 4,869,680 A | * | 9/1989 | Yamamoto | H01R 12/7005 |
| | | | | 211/41.17 |
| 5,555,157 A | * | 9/1996 | Moller | G06F 1/1626 |
| | | | | 312/223.2 |

(Continued)

FOREIGN PATENT DOCUMENTS

| FR | 1195882 A | * | 11/1959 | | H02B 1/38 |
| FR | 2696051 A1 | * | 3/1994 | | E05B 63/185 |

(Continued)

OTHER PUBLICATIONS

Vlier Stainless Steel Nylon Ball Plungers Mar. 16, 2013.pdf, 2 pages, dated Mar. 16, 2016, obtained via Wayback Machine.*

*Primary Examiner* — Andrew Roersma
(74) *Attorney, Agent, or Firm* — Muncy, Geissler, Olds & Lowe, P.C.

(57) ABSTRACT

A clamshell structure for an electronic device includes a window-type frame, a cover plate and a pivot. The window-type frame has an opening, and includes a first pivoting portion and a first fixing member. The first pivoting portion is near the opening. The first fixing member is disposed on a cover fixing area of the window-type frame. The cover plate includes a clamshell body, a second pivoting portion and a second fixing member. The clamshell body is used to cover the opening. The second pivoting portion is disposed on the opening. The second fixing member is disposed on an open side of the clamshell body. The pivot is pivoted through the first pivoting portion and the second pivoting portion. When the clamshell is opened, an electronic component is mounted into or dismounted from the opening for assembling or disassembling.

5 Claims, 9 Drawing Sheets

(58) Field of Classification Search
CPC ........ G06F 1/187; H05K 5/0004; H05K 5/03; H05K 5/02; H05K 5/0208; H05K 5/0217; H05K 5/0221; H05K 5/0239; H05K 5/0204; H05K 5/023; H05K 5/0256; H02B 1/38; H02B 1/066; H02B 1/14; H02B 1/44; H02B 11/24
See application file for complete search history.

(56) References Cited

U.S. PATENT DOCUMENTS

| | | | | |
|---|---|---|---|---|
| 6,161,909 | A * | 12/2000 | Huang | E05C 1/10 292/175 |
| 6,265,662 | B1 * | 7/2001 | Riedy | H02G 3/185 174/66 |
| 9,282,658 | B1 * | 3/2016 | Tsai | G11B 33/124 |
| 2002/0153373 | A1 * | 10/2002 | Traut | E05D 7/009 220/4.02 |
| 2008/0128966 | A1 * | 6/2008 | Tsai | F16F 1/3732 267/140.3 |
| 2012/0118602 | A1 * | 5/2012 | Remmert | H02B 1/44 174/53 |
| 2012/0244730 | A1 * | 9/2012 | Grimm | H01R 13/447 439/142 |
| 2013/0141852 | A1 * | 6/2013 | Chen | H05K 7/142 361/679.4 |
| 2014/0205394 | A1 * | 7/2014 | Chao | G11B 33/128 411/132 |
| 2014/0211401 | A1 * | 7/2014 | Lee | G06F 1/187 361/679.31 |
| 2015/0351267 | A1 * | 12/2015 | Shah | H05K 7/186 312/309 |

FOREIGN PATENT DOCUMENTS

| | | | |
|---|---|---|---|
| FR | 2719441 A1 * | 11/1995 | ............ H02B 1/44 |
| GB | 2532738 A * | 6/2016 | ............ H02B 1/26 |

* cited by examiner

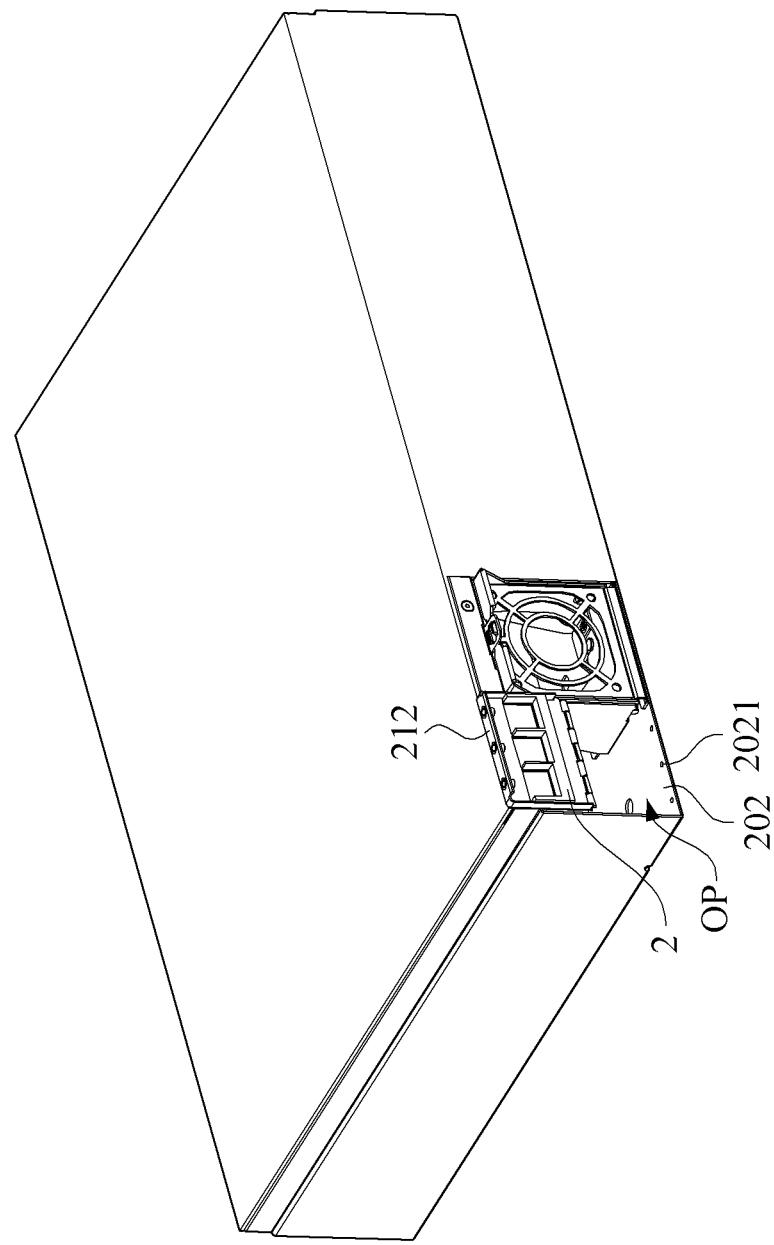

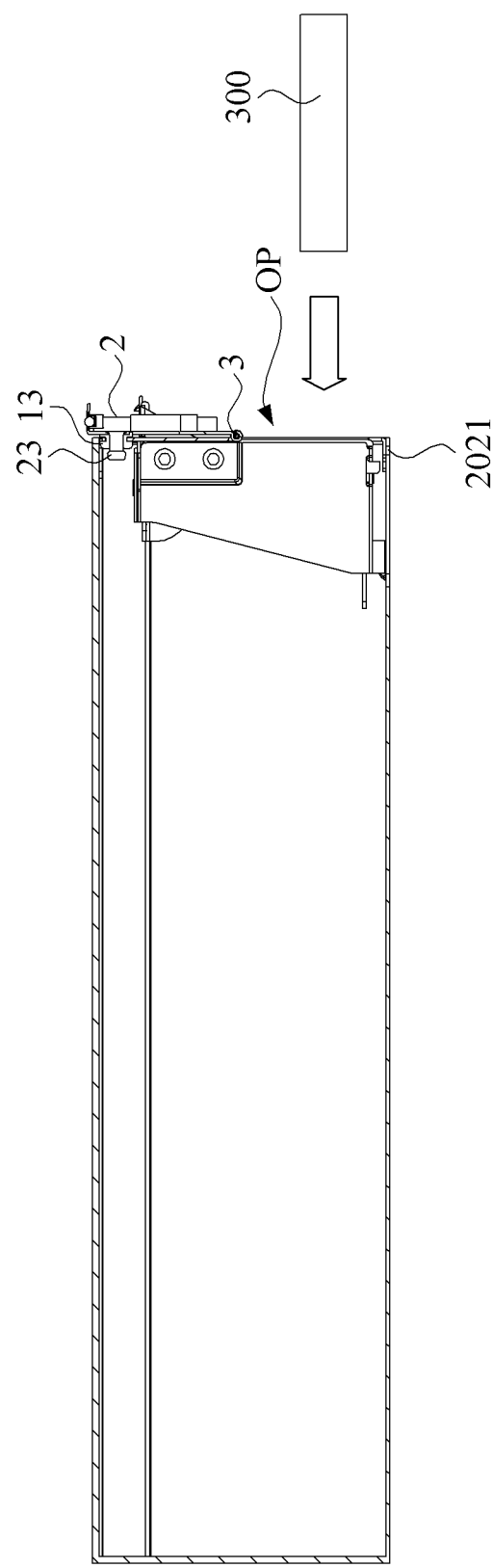

CLAMSHELL STRUCTURE FOR ELECTRONIC DEVICE

FIELD OF THE INVENTION

The present invention relates to a clamshell structure for an electronic device, especially relates to a clamshell structure for an electronic device having a clamshell cover which connects with the electronic device during assembling or disassembling.

BACKGROUND OF THE INVENTION

Generally speaking, a common electronic device has a display interface and a control interface set at the front side, while connecting/transmission wires or a heat dissipation module are set at the back side of the electronic device. Some of the electronic devices, such as a set-top box (STB), which includes a removable interface structure at the back side of the electronic device for adapting to variety of transmission interface cards. Accordingly, an assembling opening is set at the back side of the electronic devices for user assembling or disassembling purpose. While the assembling step is completed, a cover plate is necessary to be screwed onto the back side for covering the assembling opening for preventing dust in the air from entering the electronic devices.

Please referring to FIG. 1, wherein a perspective view of a prior electronic device is shown. As shown in FIG. 1, an electronic device PA100 comprises a casing body PA1, a back casing PA2, and a back plate PA3. The back casing PA2 is fixed on the back side of the casing body PA1, and the back plate PA3 is removably set on the back casing PA2. The back casing PA2 has an assembling opening for assembling transmission interface cards into the electronic device PA100. The back plate PA3 is fastened and locked on the back casing PA2 by screwing after finishing assembling or disassembling the transmission interface cards.

In view of the above-mentioned, the user usually needs to remove the back plate for assembling or disassembling the transmission interface cards in practical applications. However, when the transmission interface cards are assembled or disassembled, the back plate may have already lost, so that the user needs to buy another back plate for covering the assembling opening of the electronic device. It causes inconvenience in assembling or disassembling the transmission interface cards, and increases a cost due to another back plate bought for covering the assembling opening.

BRIEF SUMMARY OF INVENTION

As the above mentioned, a prior electronic device includes a back plate which is removably set on a back casing of an electronic device for a user assembling or disassembling transmission interface cards. The prior back plate is usually locked or fixedly screwed on the back casing for covering an assembling opening. When the user wants to assemble or disassemble electronic components, such as transmission interface cards, the back plate needs to be removed from the back casing of the electronic device first for following assembling/disassembling operation or processing. If the back plate is not collected or kept well, it may be lost during assembling or disassembling operation, so that the user usually needs to buy another back plate or prepare additional back plates that an assembling cost is increased and make assembling operation to be inconvenient. Therefore, to resolve the prior problems mentioned above, the present invention provides a more feasible and efficient clamshell structure for an electronic device, a cover plate is openably set on a back casing of the electronic device. When the user wants to assemble or disassemble electronic components, the cover plate does not necessarily be removed from the back casing of the electronic device for practical processing, so that the prior problems are resolved and the assembling cost is reduced.

For resolving the prior problems, a necessary technique of the present invention is to provide a clamshell structure for an electronic device. The clamshell structure includes a window-type frame, a cover plate, and a pivot. The window-type frame is fixedly disposed on a casing of the electronic device with an assembling opening. And the window-type frame includes a first pivoting portion and a first fixing member. The first pivoting portion is set near one side of the assembling opening, and the first fixing member is set within the cover fixing area of the window-type frame.

The cover plate includes a clamshell body, a second pivoting portion, and a second fixing member. The clamshell body is set for covering the assembling opening. The second pivoting portion is set near the one side of the assembling opening corresponding to first pivoting portion. The second fixing member is set on one side of the clamshell body far from the second pivoting portion. The pivot is connected to and pivoted through the first pivoting portion and the second pivoting portion for rotating the cover plate about the pivot. When the cover plate is opened and then the second fixing member is lifted up to approach the cover fixing area of the window-type frame, the first fixing member can be engaged with the second fixing member, so that the cover plate can remain in an open state temporarily and an assemble space is formed for assembling or disassembling operation.

In one aspect, a deriving technique of the present invention according to the above mentioned necessary technique is that the window-type frame is further formed with a first fixing hole for fixing the first fixing member, so that the cover plate can remain in the open state by engaging the first fixing member with the second fixing member.

In one aspect, a deriving technique of the present invention according to the above mentioned necessary technique is that the first fixing member is a rubber bulk. The rubber bulk is embedded within the first fixing hole, and the rubber bulk has a through hole.

In one aspect, a deriving technique of the present invention according to the above mentioned necessary technique is that a plurality of ribs are symmetrically formed within the through hole.

In one aspect, a deriving technique of the present invention according to the above mentioned necessary technique is that the second fixing member is a pillar plug. The shape of the pillar plug corresponds to the shape of the through hole.

In one aspect, a deriving technique of the present invention according to the above mentioned necessary technique is that at least one plug opening is formed on the clamshell body.

In one aspect, a deriving technique of the present invention according to the above mentioned necessary technique is that a positioning hole is formed on a bottom casing of the casing of the electronic device. The cover plate further includes at least one third fixing member set on an indent bottom plate of the clamshell body for engaging with the positioning hole.

In one aspect, a deriving technique of the present invention according to the above mentioned necessary technique is that at least one second fixing hole is formed on the indent bottom plate of the clamshell body for the third fixing member riveted to the second fixing hole.

In one aspect, a deriving technique of the present invention according to the above mentioned necessary technique is that the third fixing member includes a containing cylinder, an elastic component and a ball. The containing cylinder is set on the indent bottom plate of the clamshell body and formed with a containing space and an opening. The elastic component is restrictedly received within the containing space of the containing cylinder. The ball is received within the containing space to abut on the elastic component. The elastic component pushes the ball to make the ball exposed from the opening to be engaged with the positioning hole firmly when the cover plate covers the assembling opening.

As the above mentioned, compared with prior art that a back plate is removably set on the back casing of an electronic device and may be lost in assembling or disassembling operation, the present invention uses the cover plate engaging with the window-type frame, so that the user can lift the cover plate up to expose the assembling opening for assembling or disassembling electronic components. The present invention provides a structure for assembling or disassembling easily. The cover plate of the present invention is more feasible and efficient for practical applications and reduces the cost during assembling or disassembling.

BRIEF DESCRIPTION OF THE DRAWINGS

The objectives, technical details, features, and effects of the present invention will be better understood with regard to the detailed description of the embodiments below, with reference to the drawings.

FIG. 4 shows a perspective view of clamshell structure for an electronic device, wherein a cover plate is lifted up and fixed in a cover fixing area according to a preferred embodiment of the present invention.

FIG. 5 shows a cross-sectional view of clamshell structure for an electronic device, wherein a cover plate is lifted up and an assembling opening is opened for assembling electronic components according to a preferred embodiment of the present invention.

DETAILED DESCRIPTION OF THE INVENTION

Figure 1:
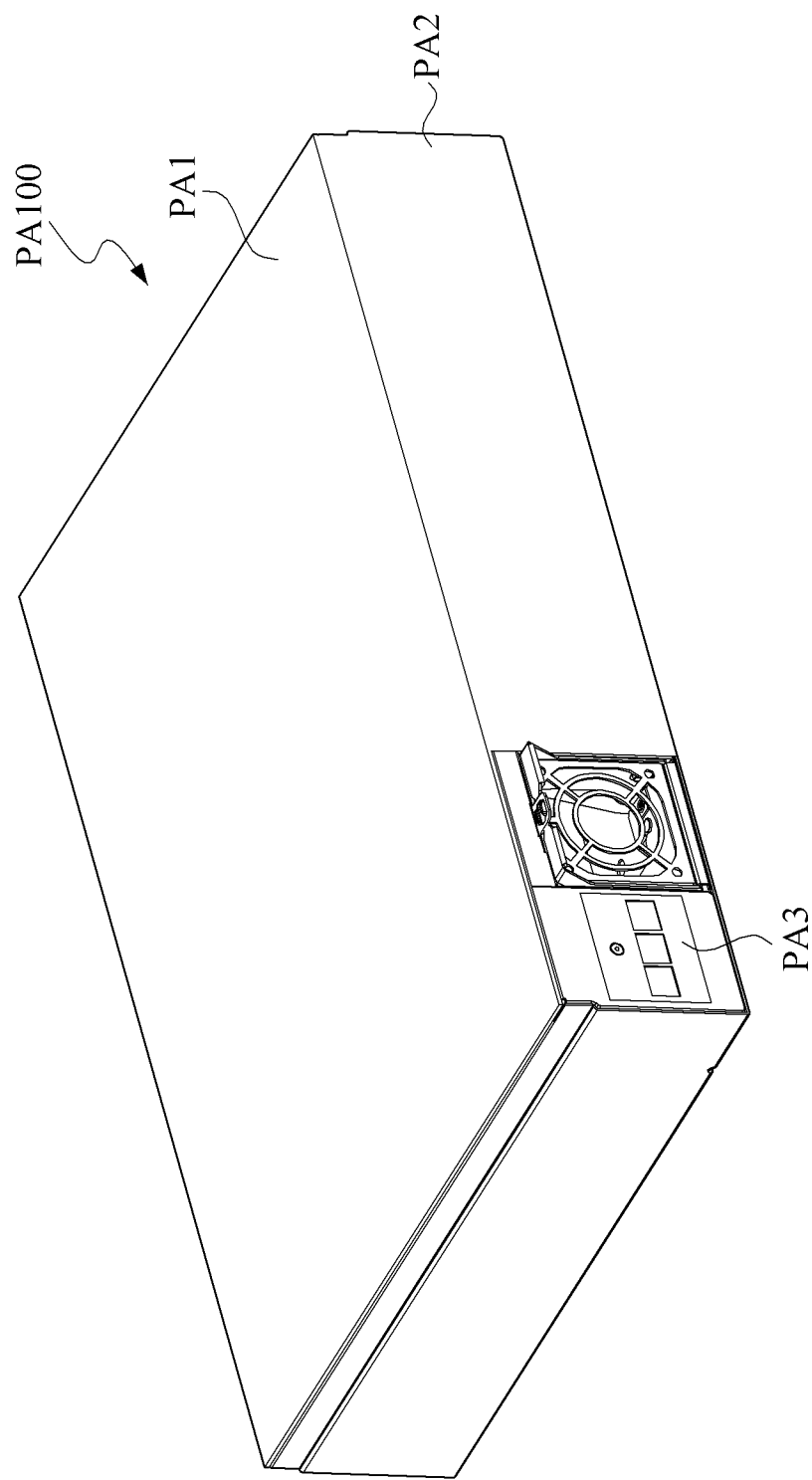
FIG. 1 shows a perspective view of a prior electronic device.
Figure 2:
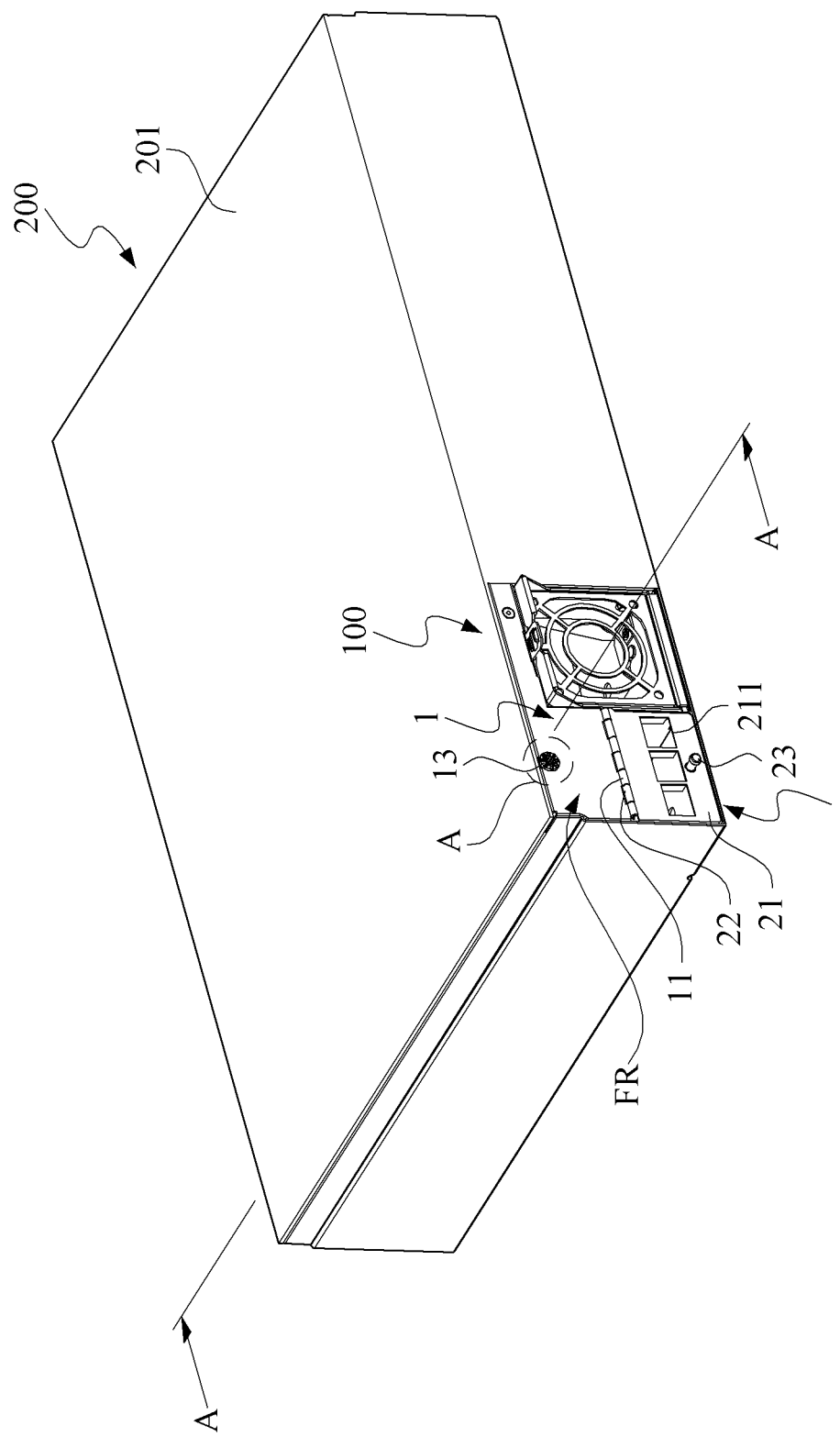
FIG. 2 shows a perspective view of clamshell structure for an electronic device according to a preferred embodiment of the present invention.
Figure 2A:
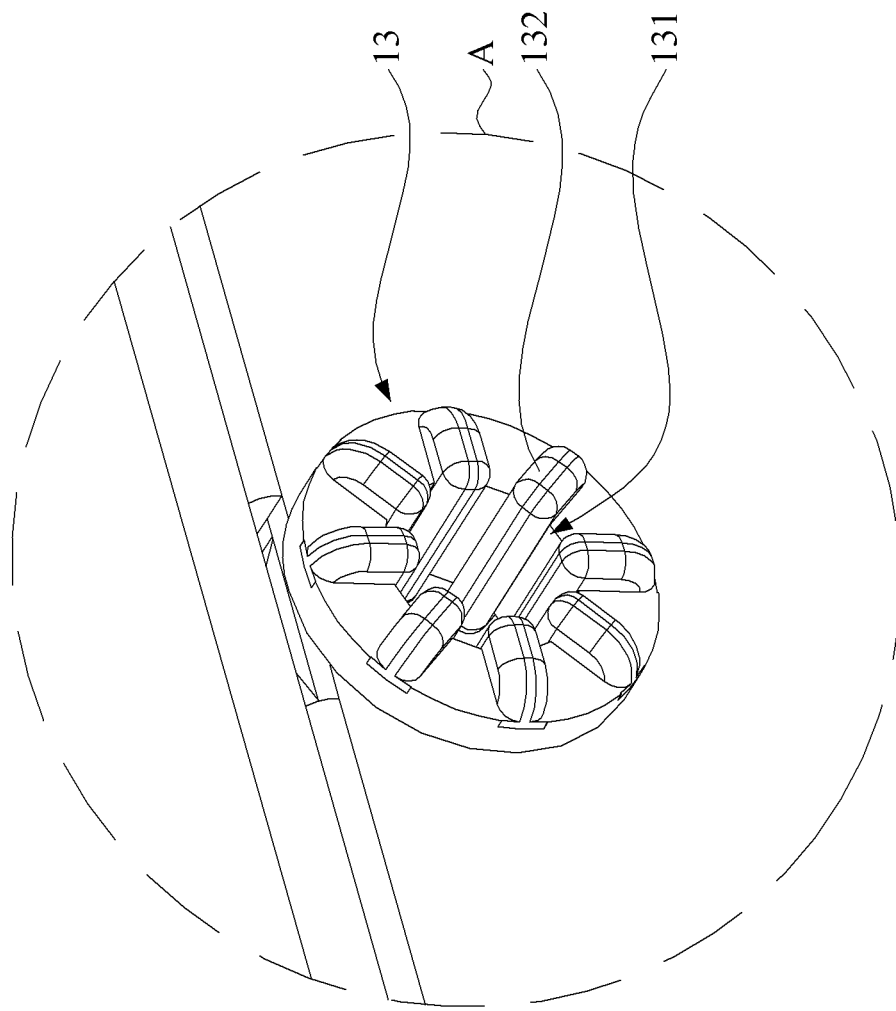
FIG. 2A shows an enlarged view of area A according to FIG. 2 of the present invention.
Figure 3:
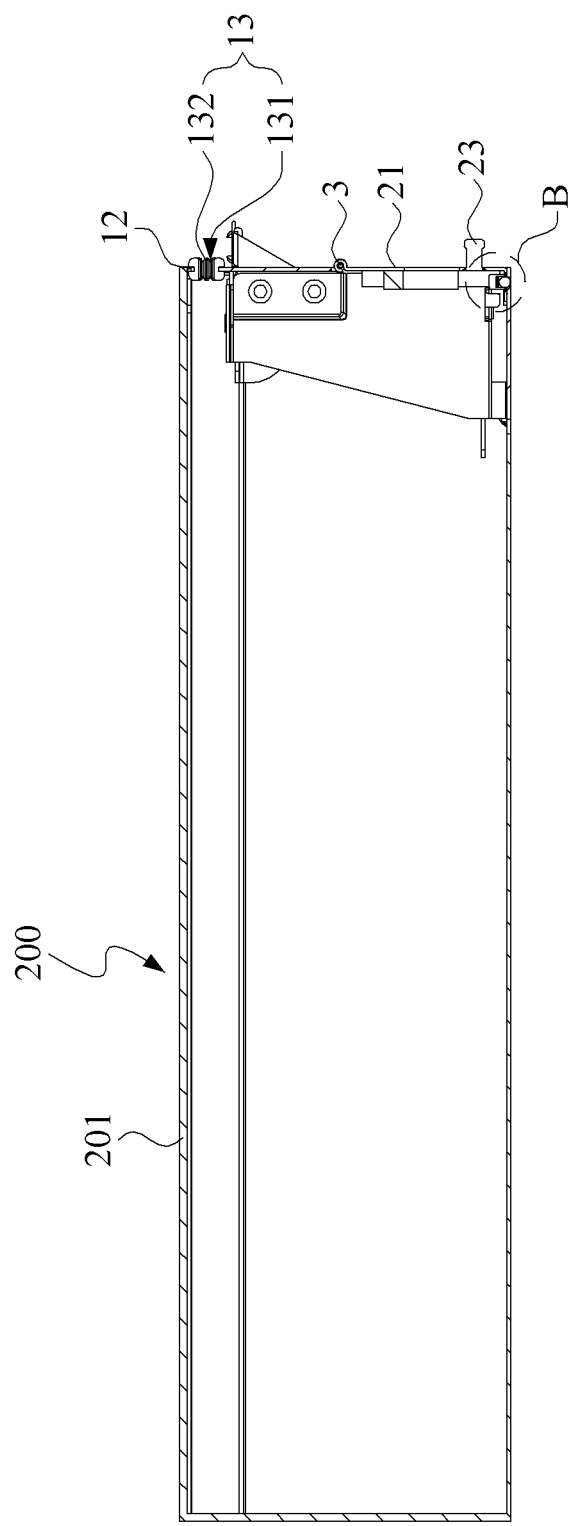
FIG. 3 shows a cross-sectional view according to a cutting line A-A shown in FIG. 2 of the present invention.
Figure 3A:
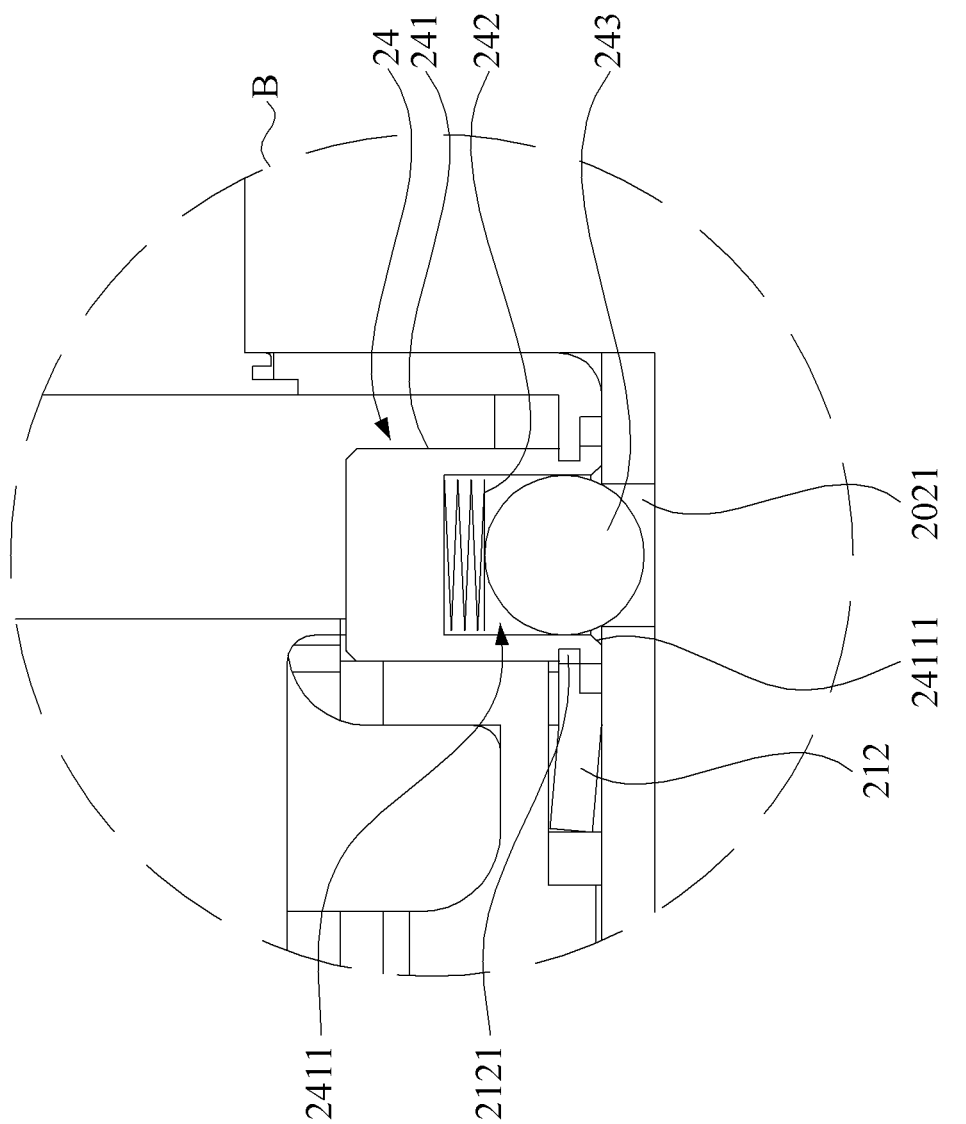
FIG. 3A shows an enlarged view of area B according to FIG. 2 of the present invention.

Please refer to FIGS. 2 to 4, wherein FIG. 2 shows a perspective view of a clamshell structure 100 for an electronic device 200 according to a preferred embodiment of the present invention; FIG. 2A shows an enlarged view of area A according to FIG. 2 of the present invention; FIG. 3 shows a cross-sectional view according to a cutting line A-A shown in FIG. 2 of the present invention; FIG. 3A shows an enlarged view of area B according to FIG. 2 of the present invention; and FIG. 4 shows a perspective view of clamshell structure for an electronic device, wherein a cover plate is lifted up and fixed in a cover fixing area according to a preferred embodiment of the present invention.

As shown in FIGS. 2 to 4, the clamshell structure 100 comprises a window-type frame 1, a cover plate 2, and a pivot 3. The window-type frame 1 is fixedly disposed on a casing 201 of the electronic device 200. The window-type frame 1 has an assembling opening OP and a cover fixing area FR. Furthermore, the window-type frame 1 includes a first pivoting portion 11, a first fixing hole 12, and a first fixing member 13.

The first pivoting portion 11 is set near one side of the assembling opening OP. The first fixing hole 12 is formed within the cover fixing area FR of the window-type frame. The first fixing member 13 is fixedly embedded in the first fixing hole 12 within the cover fixing area FR. As shown in FIGS. 2 and 3, there is a positioning through hole 131 formed on the first fixing member 13. A plurality of ribs 132, such as eight ribs 132, are symmetrically formed within the through hole 131.

The cover plate 2 includes a clamshell body 21, a second pivoting portion 22, a second fixing member 23 and three third fixing members 24 (only one of the three third fixing members is shown in FIG. 3A). The clamshell body 21 is used for covering the assembling opening OP and has at least one plug opening 211. As shown in FIG. 2, there are preferred three plug openings 211 formed on the clamshell body 21. In addition, the clamshell body 21 further includes an indent bottom plate 212 (shown in FIG. 3A) extending toward inside of the electronic device 200. The plug opening 211 is provided for plugging or connecting transmission cables for practical applications with many purposes.

The second pivoting portion 22 is set corresponding to the first pivoting portion 11 which is near the assembling opening OP. That is, the second pivoting portion 22 is also set near the one side of the assembling opening OP. The pivot 3 is connected to and pivoted through both the first pivoting portion 11 and the second pivoting portion 22, so that the cover plate 2 can rotate about the pivot 3.

The second fixing member 23 is set on one side of the clamshell body 21 far from the second pivoting portion 22 (shown in FIG. 2) or set on a liftable side (not shown in Figs.) of the clamshell body 21. When the cover plate 2 is lifted or opened, the second fixing member 23 is lifted up to approach the cover fixing area FR of the window-type frame 1. At this moment, the first fixing member 13 can be engaged with the second fixing member 23, to let the cover plate 2 be controlled and remained in an open state. Thus, the assembling opening OP is exposed, and an assemble space is formed (not shown in Figs.) for assembling or disassembling operation. That is, the cover plate 2 can be controlled and remained in the open state by engaging the first fixing member 13 with the second fixing member 23. The window-type frame 1 further has a first fixing hole for securing the first fixing member 13 firmly. In one embodiment, the first fixing member 13 can be a rubber bulk embedded within the above-mentioned first fixing hole 12, and the rubber bulk has a through hole. And the second fixing member 23 can be a pillar plug, and the shape of the pillar plug corresponds to the shape of the through hole.

As shown in FIG. 3A, there is a positioning hole 2021 formed on a bottom casing 202 of the casing 201 of the electronic device 200. The cover plate 2 further includes at least one third fixing member 24 set on an indent bottom plate 212 of the clamshell body 100 for engaging with the positioning hole 2021. The number of the third fixing member 24 is preferred to be three. The three third fixing members 24 include a containing cylinder 241, an elastic component 242 and a ball 243 respectively. The containing cylinder 241 is set on the indent bottom plate 212 of the clamshell body 21 by riveting the containing cylinder 241 to at least one second fixing hole 2121. The containing cylinder 241 is formed with a containing space 2411 and an opening 24111. The elastic component 242 is restrictedly received within the containing space 2411 of the containing cylinder 241. The ball 243 is received within the containing space 2411 and is abutted on the elastic component 242. When the cover plate 2 covers the assembling opening OP, the third fixing member 24 corresponds to three positioning holes 2021 (only one is shown in FIG. 3A) of the bottom casing 202 (shown in FIG. 4). Thus, the elastic component 242 pushes the ball 243 to be exposed from the opening, such that the third fixing member 24 engages with the positioning hole 2021 thinly.

Please refer to FIG. 5, it shows a cross-sectional view of clamshell structure for an electronic device, wherein a cover plate is lifted up and an assembling opening is opened for assembling electronic components according to a preferred embodiment of the present invention. As shown in FIG. 5, when the cover plate 2 is lifted up to make the second fixing member 23 engaged with the first fixing member 13, the cover plate 2 is then fixedly located on the cover fixing area FR. Therefore, the assembling opening OP is opened and remains in an open state stably, and the user can assemble or disassemble electronic components 300 through the assembling opening OP. In addition, in other embodiment of the present invention, the user can also assemble or disassemble electronic components from inside to outside of the electronic device 200, other than assemble or disassemble electronic components from outside to inside of electronic device 200 described according to FIG. 5.

Figure 6:
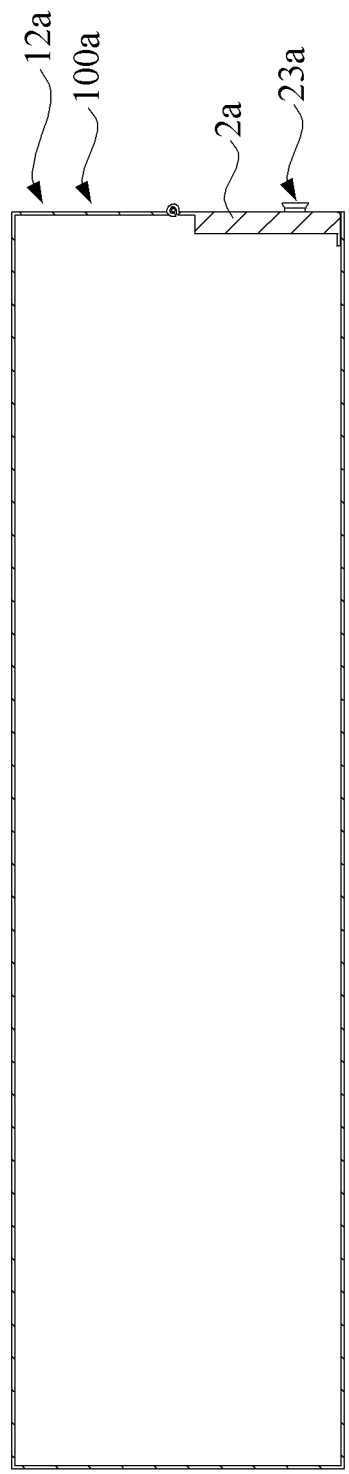
FIG. 6 shows a cross-sectional view of clamshell structure for an electronic device according to another preferred embodiment of the present invention.
Figure 7:
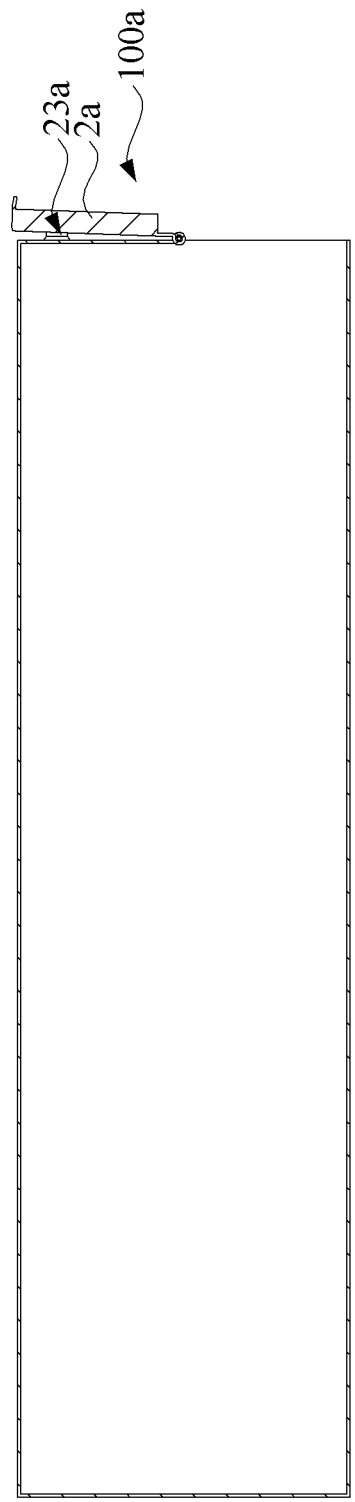
FIG. 7 shows a cross-sectional view of clamshell structure for an electronic device, wherein a cover plate is lifted up and fixed in a cover fixing area according to another preferred embodiment of the present invention.

Please refer to FIGS. 6 and 7, wherein FIG. 6 shows a cross-sectional view of clamshell structure for an electronic device according to another preferred embodiment of the present invention and FIG. 7 shows a cross-sectional view of clamshell structure for an electronic device, wherein a cover plate is lifted up and fixed in a cover fixing area according to another preferred embodiment of the present invention. As shown in FIGS. 6 and 7, a clamshell structure 100a for an electronic device is like the clamshell structure 100 described above. The only one difference between the clamshell structure 100a and the clamshell structure 100 is that a cover plate 2a includes a second fixing member 23a and a first fixing member 12a. The second fixing member 23a is different from the second fixing member 23, and the first fixing member 12a is different from the first fixing member 13. According to this embodiment shown in FIGS. 6 and 7, the first fixing member 12a is a smooth plane, and the second fixing member 23a is a sucker structure. Therefore, a user can engage the first fixing member 12a and the second fixing member 23a by sticking the sucker structure on the smooth plane, so that the cover plate 2a can remain stably in a lifted state of the cover plate.

As the above mentioned preferred embodiments of the present invention, by way of engaging the cover plate with the window-type frame of the electronic device, the cover plate can be lifted up to expose the assembling opening, so that a user can assemble or disassemble electronic components easily. Compared with prior art that a back plate is removably set on the back casing of an electronic device that the back plate may be lost during assembling or disassembling operation, the cover plate of the present invention is more feasible and efficient for practical applications and reduces the cost during assembling or disassembling.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

I claim:

1. A clamshell structure for an electronic device comprising:
    a window-type frame fixedly set on a casing of the electronic device, the window-type frame having an assembling opening and a cover fixing area, the window-type frame including:
        a first pivoting portion set near one side of the assembling opening; and
        a first fixing member set within the cover fixing area of the window-type frame;
    a cover plate, including;
        a clamshell body for covering the assembling opening;
        a second pivoting portion set near the one side of the assembling opening correspondingly; and
        a second fixing member set on one side of the clamshell body far from the second pivoting portion; and
    a pivot connected to and pivoted through the first pivoting portion and the second pivoting portion for rotating the cover plate about the pivot;
    wherein a first fixing hole is formed on the cover fixing area of the window-type frame for fixing the first fixing member, the first fixing member is a rubber bulk applied to be embedded within the first fixing hole, and the rubber bulk has a through hole with a plurality of ribs symmetrically formed therein, the second fixing member is a pillar plug, and the shape of the pillar plug corresponds to the shape of the through hole; when the cover plate is opened and the pillar plug is lifted up to approach the cover fixing area of the window-type frame, the through hole is applied to be engaged with the pillar plug second fixing member, so that the cover plate is remained in an open state and an assemble space is formed for assembling or disassembling operation.

2. The clamshell structure for an electronic device of claim 1, wherein at least one plug opening is formed on the clamshell body.

3. The clamshell structure for an electronic device of claim 1, wherein a positioning hole is formed on a bottom casing of the casing of the electronic device, and the cover plate further includes a third fixing member set on an indent bottom plate of the clamshell body for engaging the third fixing member with the positioning hole.

4. The clamshell structure for an electronic device of claim 3, wherein at least one second fixing hole is formed on the indent bottom plate of the clamshell body for riveting the third fixing member thereto.

5. The clamshell structure for an electronic device of claim 3, wherein the third fixing member includes a containing cylinder, an elastic component and a ball, the containing cylinder is set on the indent bottom plate of the clamshell body and formed with a containing space and an opening, the elastic component is restrictedly received to be within the containing space of the containing cylinder, the ball is received to be within the containing space to abut on the elastic component; and wherein the elastic component pushes the ball to make the ball exposed from the opening to be engaged with the positioning hole firmly when the cover plate covers the assembling opening.

* * * * *